(12) United States Patent
Zeng et al.

(10) Patent No.: US 10,983,154 B2
(45) Date of Patent: Apr. 20, 2021

(54) LOAD STATE DETECTION CIRCUIT AND METHOD

(71) Applicant: CONTEMPORARY AMPEREX TECHNOLOGY CO., LIMITED, Ningde (CN)

(72) Inventors: Yuqun Zeng, Ningde (CN); Kai Wu, Ningde (CN); Jirong Huo, Ningde (CN); Le Chu, Ningde (CN); Yanhui Fu, Ningde (CN); Qiandeng Li, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 90 days.

(21) Appl. No.: 16/519,127

(22) Filed: Jul. 23, 2019

(65) Prior Publication Data

US 2020/0088778 A1 Mar. 19, 2020

(30) Foreign Application Priority Data

Sep. 17, 2018 (CN) .......................... 201811079845.9

(51) Int. Cl.
  *G01R 31/00* (2006.01)
  *H02H 1/00* (2006.01)
  *H02H 3/16* (2006.01)

(52) U.S. Cl.
  CPC ......... *G01R 31/007* (2013.01); *H02H 1/0007* (2013.01); *H02H 3/16* (2013.01)

(58) Field of Classification Search
  CPC ......... H02H 1/0007; H02H 3/16; G01R 31/54
  See application file for complete search history.

(56) References Cited

U.S. PATENT DOCUMENTS

| | | | | |
|---|---|---|---|---|
| 6,056,384 A | * | 5/2000 | Sato ........................ | G01R 31/42 318/400.21 |
| 2009/0174413 A1 | * | 7/2009 | Bucella .................. | G01R 31/67 324/511 |

(Continued)

FOREIGN PATENT DOCUMENTS

| CN | 206311669 U | 7/2017 |
|---|---|---|
| CN | 107479002 A | 12/2017 |

(Continued)

OTHER PUBLICATIONS

Search Report for Chinese Patent Application No. 201811079845.9 dated Sep. 2, 2020.

(Continued)

*Primary Examiner* — Alvaro E Fortich
(74) *Attorney, Agent, or Firm* — Heslin Rothenberg Farley & Mesiti P.C.

(57) ABSTRACT

Disclosed are a load state detection circuit and method. A microcontroller is connected to a switch unit which is connected between a detecting power supply and a load to be tested. A voltage sampling point is formed at either terminal of the load to be tested, and the voltage sampling circuit is connected between the voltage sampling point and the microcontroller. The voltage sampling circuit is configured to sample a voltage at the voltage sampling point. The microcontroller is configured to connect the load to be tested and the detecting power supply by controlling the switch unit, and determine whether a fault exists in the load to be tested according to a received voltage at the voltage sampling point sampled by the voltage sampling circuit, before connecting the load to be tested with the drive power supply.

18 Claims, 10 Drawing Sheets

(56) References Cited

U.S. PATENT DOCUMENTS

| | | | | |
|---|---|---|---|---|
| 2009/0309607 A1* | 12/2009 | Arndt | ................... | G01R 31/50 |
| | | | | 324/522 |
| 2013/0162261 A1* | 6/2013 | Szoke | ................ | G01R 31/006 |
| | | | | 324/503 |
| 2015/0160281 A1* | 6/2015 | Zaki | ................... | G01R 31/006 |
| | | | | 324/543 |

FOREIGN PATENT DOCUMENTS

| | | |
|---|---|---|
| CN | 207036999 U | 2/2018 |
| CN | 107748305 A | 3/2018 |
| CN | 207225099 U | 4/2018 |
| CN | 107979060 A | 5/2018 |
| DE | 4338462 A1 | 5/1995 |
| JP | 2014091495 A | 5/2014 |

OTHER PUBLICATIONS

Extended European Search Report for European Application No. 19188497.2 dated Feb. 12, 2020.

* cited by examiner

LOAD STATE DETECTION CIRCUIT AND METHOD

CROSS-REFERENCE TO RELATED APPLICATION

This application claims the priority benefit of Chinese Patent Application Serial No. 201811079845.9 filed on Sep. 17, 2018 and entitled "LOAD STATE DETECTION CIRCUIT AND METHOD", the disclosure of which is incorporated by reference herein in its entirety.

TECHNICAL FIELD

The present disclosure relates to the field of circuit technology, especially a load state detection circuit and a load state detection method.

BACKGROUND

With the development of battery technologies, it has become a trend in the automotive industry that electric vehicles are replacing fuel vehicles. Some high-power switch devices such as relays, contactors and some loads are applied in electric vehicles, and are important for safe operation of an entire vehicle.

SUMMARY

Some embodiments of the present disclosure provides a load state detection circuit including at least a detecting power supply, a voltage sampling circuit, a switch unit, and a microcontroller. The microcontroller is connected to the switch unit which is connected between the detecting power supply and the load to be tested. A voltage sampling point is formed at either terminal of the load to be tested, and the voltage sampling circuit is connected between the voltage sampling point and the microcontroller. The voltage sampling circuit is configured to sample a voltage at the voltage sampling point, and output the voltage to the microcontroller. The microcontroller is configured to connect the load to be tested and the detecting power supply by controlling the switch unit, and determine whether a fault exists in the load to be tested according to a received voltage at the voltage sampling point sampled by the voltage sampling circuit, before conductively connecting the load to be tested with the drive power supply. The microcontroller is further configured to disconnect the load to be tested from the detecting power supply and control conduction between the load to be tested and the drive power supply by controlling the switch unit when it is determined that no fault exists in the load to be tested.

Some embodiments of the present disclosure further provides a load state detection method applied to a microcontroller of a load state detection circuit including at least a detecting power supply, a voltage sampling circuit, a switch unit, and a microcontroller. Before conductively connecting the load to be tested with the drive power supply, the load to be tested is connected with the detecting power supply by controlling the switch unit, a voltage sampled by the voltage sampling circuit at the voltage sampling point is received, and it is determined whether a fault exists in the load to be tested according to a voltage sampled by the voltage sampling circuit at the voltage sampling point. The switch unit is controlled to disconnect the load to be tested from the detecting power supply and control conduction between the load to be tested and the drive power supply, when it is determined that no fault exists in the load to be tested.

In these embodiments, compared with the existing technologies, before the load to be tested is conductively connected with the drive power supply, i.e., before powering on the load to be tested, the load to be tested and the detecting power supply are connected by controlling the switch unit. At this time, a voltage at the voltage sampling point (the voltage sampling point is formed at either terminal of the load to be tested) is sampled by the voltage sampling circuit, it is determined whether a fault exists in the load to be tested according to the received voltage at the voltage sampling point, and when it is determined that no fault exists in the load to be tested, the load to be tested is disconnected from the detecting power supply by controlling the switch unit, so as to avoid interference of the detecting power supply, and power on the load to be tested. In the present disclosure, before the load to be tested is powered on, it is possible to determine in advance whether a fault exists in the load to be tested. The load to be tested will not be powered on until it is determined that no fault exists in the load to be tested, thereby safety is improved.

Further, the microcontroller is configured to disconnect the load to be tested from the detecting power supply by controlling the switch unit, and determine whether the load to be tested and the drive power supply are short-circuited according to whether the received voltage at the voltage sampling point is a voltage of the drive power supply, before conductively connecting the load to be tested with the drive power supply. This embodiment provides a specific implementation of how to determine whether a load to be tested and a drive power supply are short-circuited.

Further, the load state detection circuit further includes a first voltage divider circuit. The switch unit is connected to a first terminal of the first voltage divider circuit, a second terminal of the first voltage divider circuit is connected to an terminal of the load to be tested, and a third terminal of the first voltage divider circuit is grounded. In this embodiment, the first voltage divider circuit arranged at the voltage sampling point prevents the voltage sampled by the voltage sampling circuit from being too high to damage the microcontroller.

Further, the first voltage divider circuit includes a first resistor network and a second resistor network. The switch unit is connected to one terminal of the first resistor network, the other terminal of the first resistor network is connected to an terminal of the second resistor network, and the other terminal of the second resistor network is grounded. The one terminal of the first resistor network forms the first terminal of the first voltage divider circuit. A junction of the first resistor network and second resistor network is connected to a terminal of the load to be tested where the voltage sampling point is formed. The junction of the first resistor network and second resistor network forms the second terminal of the first voltage divider circuit. This embodiment provides a specific structure of a voltage divider circuit.

Further, the switch unit is a first switch whose control terminal is connected to the microcontroller, one terminal of the first switch is connected to at least one detecting power supply, the other terminal of the first switch is connected to the first terminal of the first voltage divider circuit, and the second terminal of the first voltage divider circuit is connected to an terminal of the load to be tested where the voltage sampling point is formed. The microcontroller is specifically configured to control the first switch to switch on, determine that a grounding short circuit fault occurs to an terminal of the load to be tested where the voltage sampling point is formed when the received voltage at the voltage sampling point is equal to zero, and determine that a grounding short circuit fault occurs to an terminal of the load to be tested where no voltage sampling point is formed when the received voltage at the voltage sampling point is within a first preset range. This embodiment provides an implementation of determining a specific fault type of the load to be tested when the switch unit is the first switch and the second terminal of the first voltage divider circuit is connected to a terminal of the load to be tested where a voltage sampling point is formed.

Further, the switch unit is the first switch whose control terminal is connected to the microcontroller, one terminal of the first switch is connected to at least one detecting power supply, the other terminal of the first switch is connected to the first terminal of the first voltage divider circuit, and the second terminal of the first voltage divider circuit is connected to an terminal of the load to be tested where no voltage sampling point is formed. The microcontroller is specifically configured to control the first switch to switch on, and determine that a fault occurs to the load to be tested when the received voltage at the voltage sampling point is equal to zero. This embodiment provides an implementation of determining whether a fault exists in the load to be tested when the switch unit is the first switch and the second terminal of the first voltage divider circuit is connected to an terminal of the load to be tested where no voltage sampling point is formed.

Further, the switch unit includes a second switch and a third switch. A control terminal of the second switch and a control terminal of the third switch are respectively connected to the microcontroller, the load state detection circuit further includes a second voltage divider circuit. A first terminal of the second switch and a first terminal of the third switch are respectively connected to the at least one detecting power supply, a second terminal of the second switch is connected to the first terminal of the first voltage divider circuit, a second terminal of the third switch is connected to a first terminal of the second voltage divider circuit, the second terminal of the first voltage divider circuit and a second terminal of the second voltage divider circuit are connected to two terminals of the load to be tested, respectively, and a third terminal of the second voltage divider circuit is grounded. The microcontroller is specifically configured to control the second switch to switch on, determine that a grounding short circuit fault occurs to an terminal of the load to be tested where the voltage sampling point is formed when the received voltage at the voltage sampling point is equal to zero, and determine that a grounding short circuit fault occurs to an terminal of the load to be tested where no voltage sampling point is formed when the received voltage at the voltage sampling point is within the first preset range. This embodiment provides an implementation of determining a specific fault type of the load to be tested when the switch unit includes the second switch and third switch.

Further, the microcontroller is configured to control the second switch to switch off and the third switch to switch on, and determine that an open circuit fault occurs to the load to be tested when the received voltage at the voltage sampling point is equal to zero. This embodiment provides a specific implementation of determining whether an open-circuit fault occurs to the load to be tested.

Further, there are two detecting power supplies, one of which is connected to the first terminal of the second switch, while the other is connected to the first terminal of the third switch.

Further, the voltage sampling circuit includes a filter unit and an analog-to-digital converter. A first terminal of the analog-to-digital converter is connected to the voltage sampling point via the filter unit, while a second terminal of the analog-to-digital converter is connected to the microcontroller. This embodiment provides a specific structure of a voltage sampling circuit.

Further, the load state detection circuit includes at least one anti-reverse diode, and at least one terminal of the load to be tested is connected to the switch unit via the at least one anti-reverse diode. In this embodiment, an anti-reverse diode is arranged between the detecting power supply and the load to be tested to avoid countercurrent, which protects the detection circuit, and prevents a detecting loop from being interfered, which may have affected judgment on a fault of the load to be tested.

Further, a resistance value of the first resistor network and second resistor network is greater than an internal resistance of the load to be tested. This embodiment may prevent the detecting power supply from powering on the load to be tested during detection, which may achieve testing the load to be tested in a case where the detecting power supply has not power on the load to be tested.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

The embodiments of the present disclosure will be described in detail below with reference to the accompanying drawings in order to make the objectives, technical solutions and advantages of the present disclosure clearer. However, it will be apparent to those skilled in the art that, in the various embodiments of the present disclosure, numerous technical details are set forth in order to provide the reader with a better understanding of the present application. However, the technical solutions claimed in the present application may be implemented without these technical details and various changes and modifications based on the following embodiments.

The inventor finds that at least the following problems exist in the existing technologies: due to complicated driving conditions and life span of loads per se, failures may occur to high-power switch devices causing dangers.

Nowadays, after a high-power switch device is powered on, its drive circuit has corresponding protection functions, such as over-temperature protection and over-current protection. However, these are passive protection means that will not work until the device is powered on.

Figure 1:
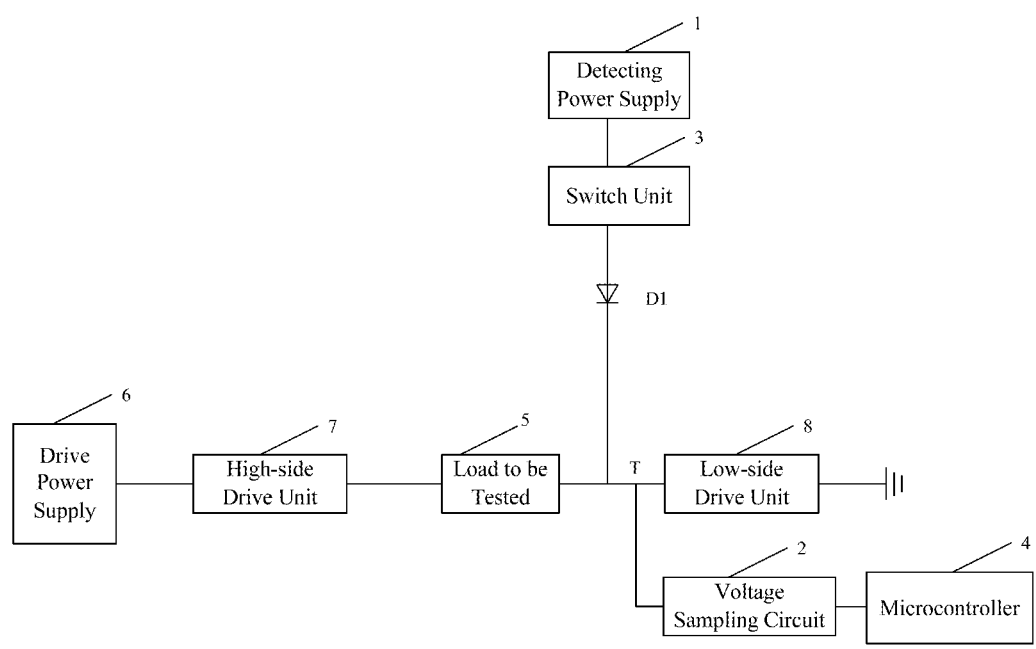
FIG. 1 is a structural diagram of a load state detection circuit according to the present disclosure.
Figure 2:
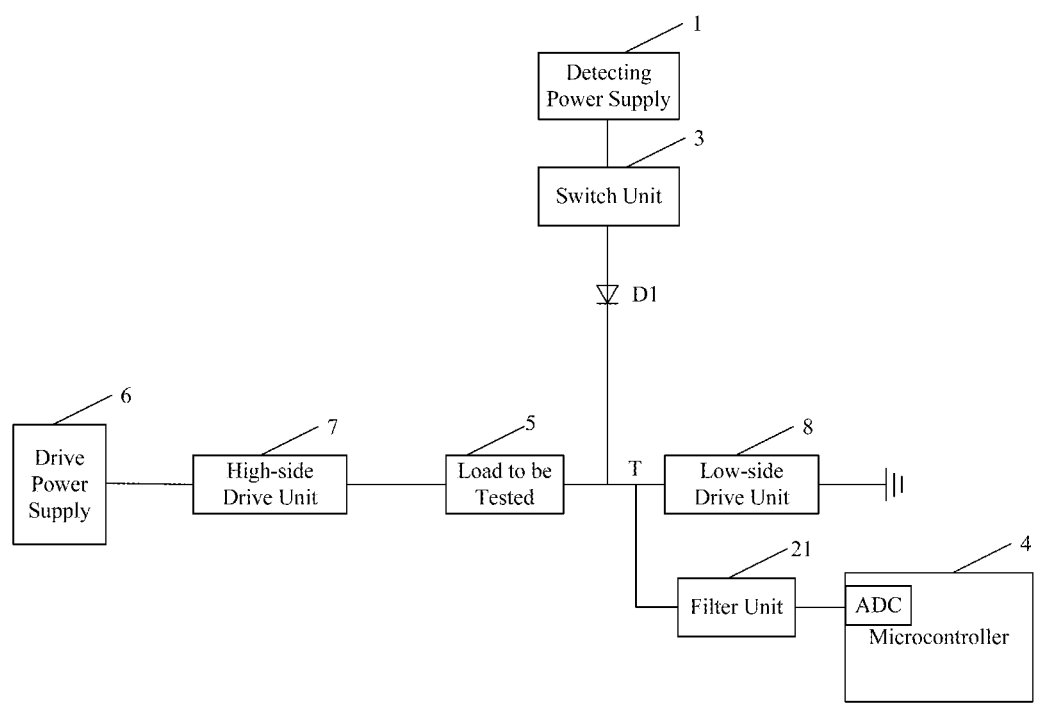
FIG. 2 is a structural diagram of the load state detection circuit according to the present disclosure, wherein a detecting power supply is connected to a low-side of a load to be tested.
Figure 3:
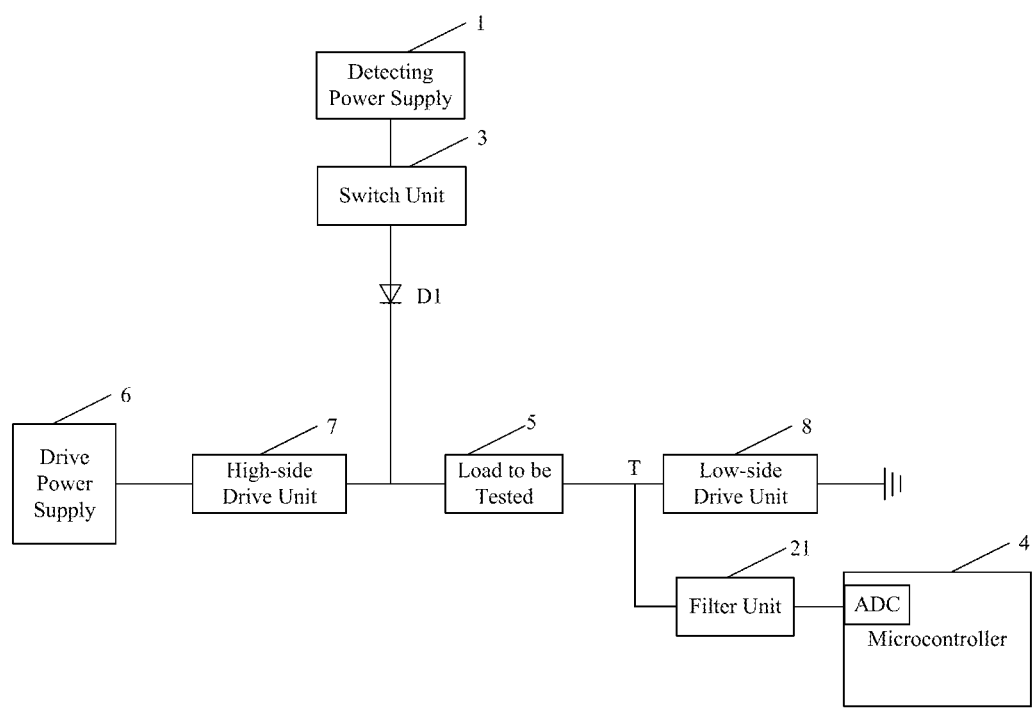
FIG. 3 is a structural diagram of the load state detection circuit according to the present disclosure, wherein the detecting power supply is connected to a high-side of the load to be tested.

In view of the above, some embodiments of the present disclosure relates to a load state detection circuit for detecting whether a fault exists in a load to be tested. The load to be tested may be a load in an electric vehicle, such as a relay, a water pump, a valve and so on, and the load to be tested is powered on by a drive power supply. The drive power supply may be a drive power supply of the electric vehicle. However, the present disclosure is not limited hereto, but it may otherwise be another power supply in the electric vehicle. With reference to FIGS. 1 to 3, the load state detection circuit includes at least one detecting power supply 1, a voltage sampling circuit 2, a switch unit 3 and a microcontroller 4.

The microcontroller 4 is connected to the switch unit 3 which is connected between the detecting power supply and a terminal of a load 5 to be tested. That is, one terminal of the switch unit 3 is connected to the detecting power supply 1, while the other terminal of the switch unit 3 is connected to a terminal of the load to be tested. A voltage sampling point T is formed at either terminal of the load 5 to be tested. The voltage sampling circuit 2 is connected between the voltage sampling point T and the microcontroller 4.

The voltage sampling circuit 2 is configured to sample a voltage at the voltage sampling point T, and output the voltage to the microcontroller 4. In one example, the voltage sampling circuit 2 includes a filter unit 21 and an analog-to-digital converter 22, wherein a first terminal of the analog-to-digital converter 22 is connected to the voltage sampling point T via the filter unit 21, while a second terminal of the analog-to-digital converter 22 is connected to the microcontroller 4. An interference signal in the voltage at the voltage sampling point T is filtered by the filter unit 21 to improve accuracy of the voltage sampled by the analog-to-digital converter 22. In this embodiment, the filter unit 21 may be a capacitor. During detection, it may select an appropriate delay time according to charge and discharge time of the capacitor for detection.

In one example, an analog-to-digital converter ADC inside the microcontroller 4 may be used as the analog-to-digital converter 22 of the voltage sampling circuit 2. However, the present disclosure is not limited hereto, but other sampling chip may otherwise be used as the voltage sampling circuit 2.

The microcontroller 4 is configured to connect the load 5 to be tested and the detecting power supply 1 by controlling the switch unit 3, and determine whether a fault exists in the load 5 to be tested according to a received voltage at the voltage sampling point T sampled by the voltage sampling circuit 2, before conductively connecting the load 5 to be tested and the drive power supply 6. The conduction of the drive power supply 6 with the load 5 to be tested is simultaneously controlled by a high-side drive unit 7 and a low-side drive unit 8. The drive power supply 6 is connected to a high-side of the load 5 to be tested via the high-side drive unit 7. A low-side of the load 5 to be tested is grounded via the low-side drive unit 8. It shall be noted that, in this embodiment and the following embodiments, the load 5 to be tested is conductively connected with the drive power supply 6, means that, the drive power supply powers the load 5 to be tested on. The "power on (or conductively connect)" herein refers to that the drive power supply provides enough large current and drive the load 5 to be tested to work. That the load 5 to be tested is connected with the detecting power supply 1 means the load 5 to be tested is electrically connected with the detecting power supply 1 but the detecting power supply 1 does not power on the load 5 to be tested; herein, the detecting power supply 1 is electrically connected with the load 5 to be tested, but provides small current not enough for driving the load 5 to be tested to work.

In one example, the load state detection circuit further includes at least an anti-reverse diode D1. At least one terminal is connected to the switch unit via at least the anti-reverse diode D1 to avoid countercurrent and protect the detection circuit. Besides, a detecting loop is prevented from being interfered, thereby judgment on a fault of the load 5 to be tested is not affected.

The microcontroller 4 is further configured to control conduction between the load 5 to be tested and the drive power supply 6, and disconnect the load 5 to be tested from the detecting power supply by controlling the switch unit 3, when it is determined that no fault exists in the load 5 to be tested.

It shall be noted that, in this context, connection relationships between the microcontroller 4 and the three of the switch unit 3, the high-side drive unit 7 and the low-side drive unit 8 are not embodied in the drawings to maintain clearness of the figures. However, the switch unit 3, the high-side drive unit 7, and the low-side drive unit 8 are all controlled by the microcontroller 4.

FIGS. 2 and 3 will be taken as examples for a detailed description of a way in which a load state detection circuit determines a fault of a load 5 to be tested.

With reference to FIG. 2, a drive power supply 6 is connected to the high-side of the load 5 to be tested via a high-side drive unit 7, and a low-side of the load 5 to be tested is grounded via a low-side drive unit 8. The microcontroller 4 outputs a control signal to control the high-side drive unit 7 and the low-side drive unit 8. There is one detecting power supply 1. The detecting power supply 1 is connected to the switch unit 3, and the switch unit 3 is connected to the low-side of the load 5 to be tested via the anti-reverse diode D1. The voltage sampling point T is formed at the low-side of the load 5 to be tested. A first terminal of the filter unit 21 is connected to the voltage sampling point T, and a second terminal of the filter unit 21 is connected to an ADC in the microcontroller 4. It shall be noted that, in this context, that the voltage sampling point T is formed at the low-side of the load 5 to be tested is taken as an example for description, to which the present disclosure is not limited, but the voltage sampling point T may otherwise be formed at the high-side of the load 5 to be tested. The high-side of the load 5 to be tested refers to the terminal connected to the positive electrode of the drive power supply 6, and the low-side of the load 5 to be tested refers to the terminal connected to the negative electrode of the drive power supply 6. It shall be noted that grounding in the context means being connected to the detecting power supply 1 and the negative electrode of the drive power supply 6.

The microcontroller 4 connects the detecting power supply 1 and the low-side of the load 5 to be tested by controlling the switch unit 3. The ADC in the microcontroller 4 samples a voltage $V_T$ at the voltage sampling point T. The microcontroller 4 determines that a grounding short circuit fault occurs to the low-side of the load 5 to be tested when $V_T$ is equal to zero. It shall be noted that, in practice, due to an ADC sampling error, a transmission line impedance, a software calculation error and so on, a fluctuation value $V_b$ may be preset, and when $V_T < V_b$, it may be determined that a grounding short circuit occurs to the low-side of the load 5 to be tested.

With reference to FIG. 3, the drive power supply 6 is connected to the high-side of the load 5 to be tested via the high-side drive unit 7, and the low-side of the load 5 to be tested is grounded via the low-side drive unit 8. The microcontroller 4 outputs a control signal to control the high side drive unit 7 and the low side drive unit 8. There is one detecting power supply 1. The detecting power supply 1 is connected to the anti-reverse diode D1 which is connected to the high-side of the load 5 to be tested via the switch unit 3. A voltage sampling point T is formed at the low-side of the load 5 to be tested. The first terminal of the filter unit 21 is connected to the voltage sampling point T, and the second terminal of the filter unit 21 is connected to the ADC in the microcontroller 4.

The microcontroller 4 connects the detecting power supply 1 with the high-side of the load 5 to be tested by controlling the switch unit 3. The ADC in the microcontroller 4 samples the voltage $V_T$ at the voltage sampling point T. The microcontroller 4 determines that a fault occurs to the load 5 to be tested when $V_T$ is equal to a theoretical value zero or fluctuates within a certain range of the theoretical value zero.

In one example, in this embodiment, the microcontroller 4 is further configured to disconnect the load 5 to be tested from the detecting power supply 1 by controlling the switch unit 3, and determine whether the load 5 to be tested and the drive power supply 6 are short-circuited according to whether the received voltage at the voltage sampling point T is a voltage of the drive power supply 6, before conductively connecting the load 5 to be tested with the drive power supply 6. Take FIG. 2 as an example. The microcontroller 4 disconnects the detecting power supply 1 from the low-side of the load 5 to be tested by controlling the switch unit 3, and the ADC in the microcontroller 4 samples the voltage $V_T$ at the voltage sampling point T. The microcontroller 4 determines that the load 5 to be tested and the drive power supply 6 are short-circuited when $V_T$ is equal to the voltage of the drive power supply 6 or fluctuates within a certain range of the voltage of the drive power supply 6.

Figure 4:
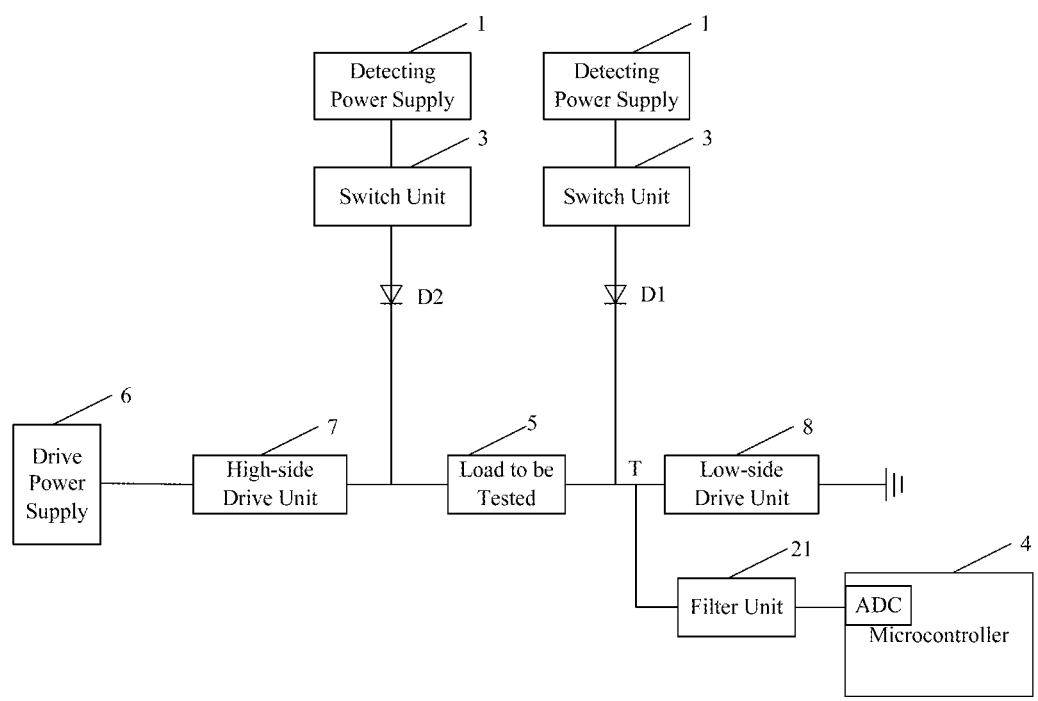
FIG. 4 is a structural diagram of a load state detection circuit according to the present disclosure, wherein detecting power supplies are connected to two terminals of the load to be tested, respectively.

It shall be noted that, FIGS. 2 and 3 may be combined to form a load state detection circuit as shown in FIG. 4 where there are two detecting power supplies 1 and two switch units 3. The two detecting power supplies 1 are connected to the anti-reverse diode D1 and the anti-reverse diode D2 via two switch unit 3, respectively. The anti-reverse diode D1 and the anti-reverse diode D2 are connected to two terminals of the load 5 to be tested, respectively. The voltage sampling point T may be formed at the high-side or low-side of the load 5 to be tested (the figure takes forming a low terminal of the load 5 as an example), so as to implement all detection functions of FIGS. 2 and 3 as described above. The two detecting power supplies 1 may be identical or different, to which this disclosure does not impose any limitation.

It shall further be noted that when the detecting power supply 1 is only connected to one terminal of the load 5 to be tested, the anti-reverse diode may not be provided, to which this disclosure does not impose any limitation.

In this disclosure, compared with the existing technologies, before the load to be tested and the drive power supply are powered on, i.e., before powering on the load to be tested, the load to be tested and the detecting power supply are connected by controlling the switch unit. At this time, a voltage at the voltage sampling point (the voltage sampling point is formed at either terminal of the load to be tested) is sampled by the voltage sampling circuit, it is determined whether a fault exists in the load to be tested according to the received voltage at the voltage sampling point, and when it is determined that no fault exists in the load to be tested, the load to be tested is disconnected from the detecting power supply by controlling the switch unit so as to avoid interference of the detecting power supply, and power on the load to be tested. In the present disclosure, before the load to be tested is powered on, it is possible to determine in advance whether a fault exists in the load to be tested. The load to be tested will not be powered on until it is determined that no fault exists in the load to be tested, thereby safety is improved.

Figure 5:
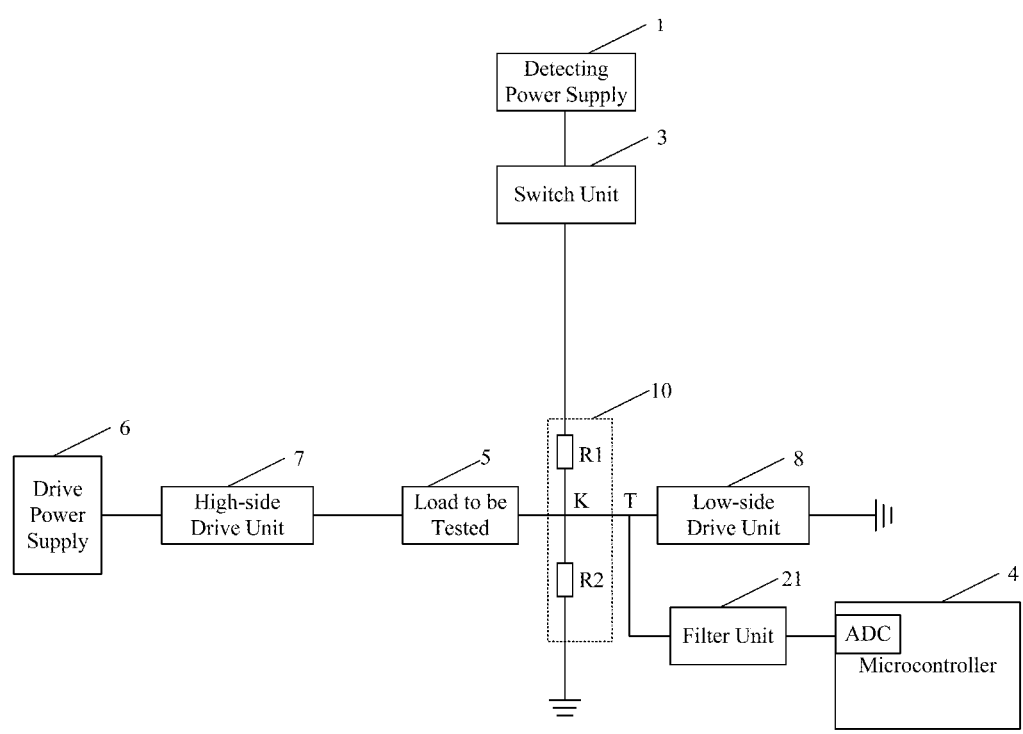
FIG. 5 is a structural diagram of a load state detection circuit according to the present disclosure.

With reference to FIG. 5, the load state detection circuit further includes a first voltage divider circuit 10.

The switch unit 3 is connected to a first terminal of the first voltage divider circuit 10. A second terminal of the first voltage divider circuit 10 is connected to the load 5 to be tested. A third terminal of the first voltage divider circuit 10 is grounded.

In one example, the first voltage divider circuit 10 includes a first resistor network and a second resistor network. The switch unit 3 is connected to one terminal of the first resistor network, and the other terminal of the first resistor network is connected to a terminal of the second resistor network. The one terminal of the first resistor network forms the first terminal of the first voltage divider circuit 10. A junction K of the first resistor network and second resistor network forms the second terminal of the first voltage divider circuit 10, and the other terminal of the second resistor network forms the third terminal of the first voltage divider circuit 10. It shall be noted that in this context, that the first resistor network is a first resistor R1 and the second resistor network is a second resistor R2 is taken as an example for description, but this disclosure does not impose any limitation to the specific structures of the first resistor network and the second resistor network.

Take FIG. 5 as an example for description. There is one detecting power supply 1. The detecting power supply 1 is connected to the first terminal of the first voltage divider circuit 10 via the switch unit 3, and the second terminal of the first voltage divider circuit 10 is connected to the low-side of the load 5 to be tested, and the voltage sampling point T is formed at the low-side of the load 5 to be tested.

In one example, a resistance value of the first resistor network and a resistance value of the second resistor network are greater than an internal resistance r of the load 5 to be tested. In one example, the resistance value of the first resistor R1 and the resistance value of the second resistor R2 are ten times the internal resistance r of the load 5 to be tested, thereby reducing current in the circuit when performing detection. While, generally, large current is needed when powering on the load 5 to be tested. That is, the load 5 to be tested is detected in a case when the detecting power supply 1 does not power on the load 5 to be tested.

In this way, the first voltage divider circuit arranged at the voltage sampling point prevents the voltage sampled by the voltage sampling circuit from being too high to damage the microcontroller. Besides, a specific structure of the first voltage divider circuit is provided.

Figure 6:
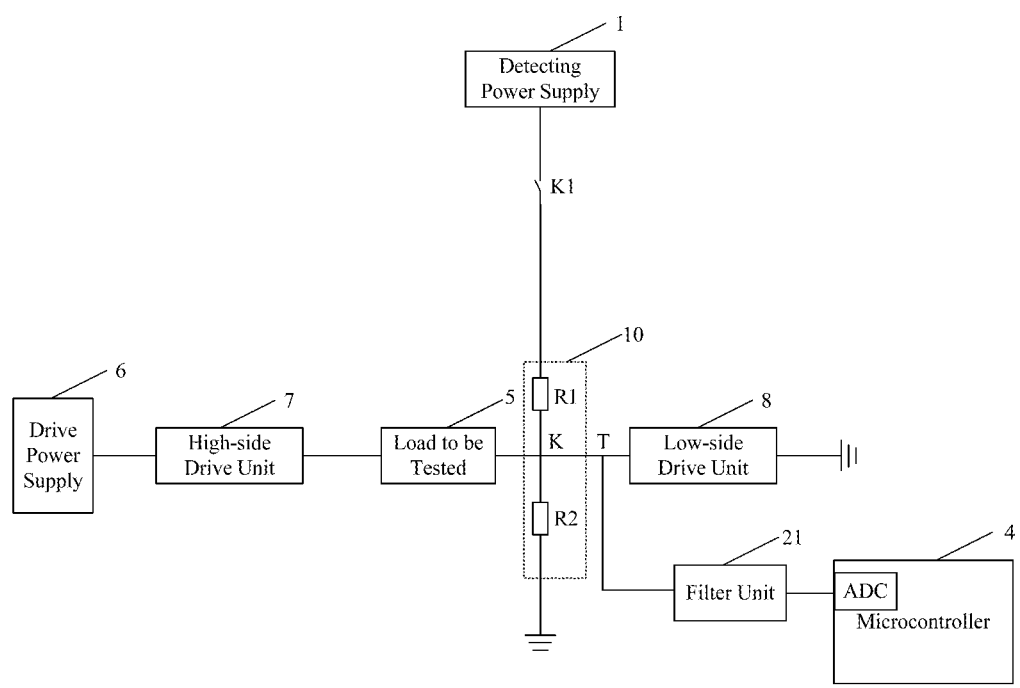
FIG. 6 is a structural diagram of a load state detection circuit according to the present disclosure, wherein a second terminal of a first voltage divider circuit is connected to an terminal of the load to be tested where a voltage sampling point is formed.

With reference to FIG. 6, it is provided a specific way of determining a fault in the load to be tested when the switch unit 3 is a first switch K1.

The switch unit 3 is the first switch K1 whose control terminal is connected to the microcontroller 4. The microcontroller 4 may control switch on and switch off of the first switch K1. One terminal of the first switch K1 is connected to the detecting power supply 1, and the other terminal of the first switch K1 is connected to the first terminal of the first voltage divider circuit 10.

When the second terminal of the first voltage divider circuit 10 is connected to an terminal of the load to be tested where a voltage sampling point is formed, with reference to FIG. 6, the microcontroller 4 is specifically configured to control the first switch K1 to switch on and receive the sampled voltage $V_T$ by the ADC at the voltage sampling point T. When $V_T$ is equal to zero, the microcontroller 4 determines that a grounding short circuit fault occurs to the terminal of the load 5 to be tested where the voltage sampling point T is formed, that is, a grounding short circuit occurs to the low-side of the load 5 to be tested as shown in FIG. 6.

When $V_T$ is within a first preset range, the microcontroller 4 determines that a grounding short circuit fault occurs to the terminal of the load 5 to be tested where the voltage sampling point T is not formed, that is, the grounding short circuit fault occurs to the high-side of the load 5 to be tested as shown in FIG. 6. The first preset range shall be set according to the first resistor R1, the second resistor R2, the internal resistance r of the load 5 to be tested, and the voltage V of the detecting power supply. Specifically, suppose a grounding short circuit fault occurs to the high-side of the load 5 to be tested, then a theoretical value of the voltage $V_T$ at the voltage sampling point T is V*r*R2/(r*R2+R1*r+R1*R2). If a fluctuation value $V_{b1}$ is preset on the basis of the theoretical value, it may be obtained that the first preset range is [V*r*R2/(r*R2+R1*r+R1*R2)−$V_{b1}$, V*r*R2/(r*R2+R1*r+R1*R2)+$V_{b1}$].

Figure 7:
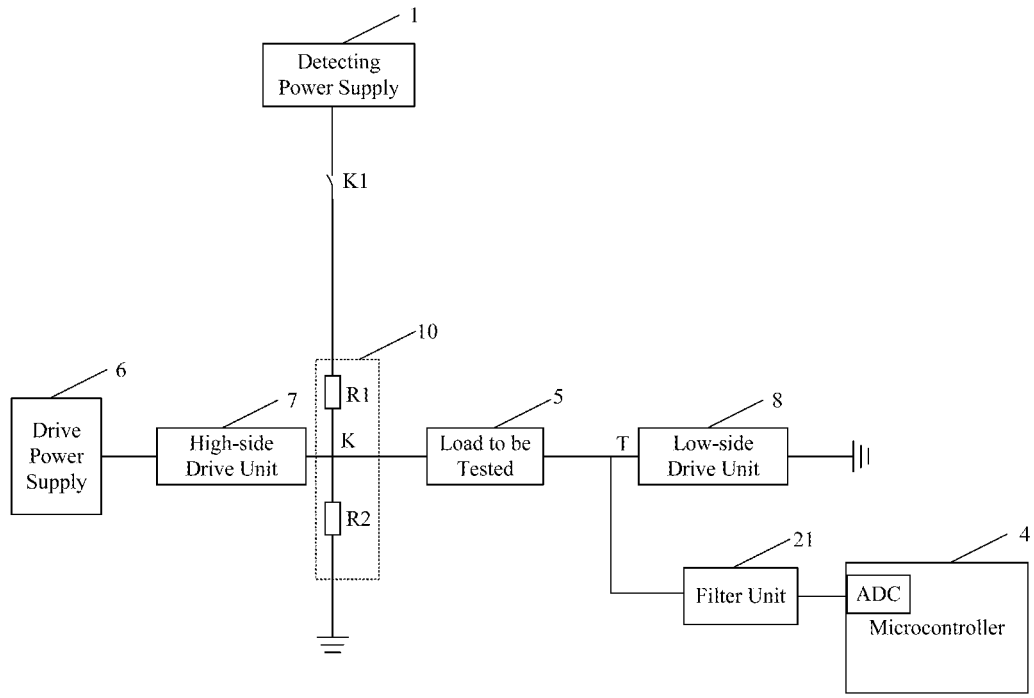
FIG. 7 is a structural diagram of a load state detection circuit according to the present disclosure, wherein the second terminal of the first voltage divider circuit is connected to an terminal of the load to be tested where no voltage sampling point is formed.

When the second terminal of the first voltage divider circuit 10 is connected to an terminal of the load to be tested where the voltage sampling point is not formed, with reference to FIG. 7, the microcontroller 4 is specifically configured to control the first switch K1 to switch on. When the received voltage $V_T$ at the voltage sampling point T is equal to the theoretical value zero, or fluctuates within a certain range of the theoretical value zero, it is determined that a fault occurs to the load 5 to be tested.

Before controlling the first switch K1 to switch on, the microcontroller 4 determines whether the load 5 to be tested and the drive power supply 6 are short-circuited by controlling the first switch K1 to disconnect the load 5 to be tested from the detecting power supply 1 and according to whether the received voltage at the voltage sampling point T is a voltage of the drive power supply 6. Take FIG. 6 for example, where the microcontroller 4 controls the first switch K1 to disconnect the detecting power supply 1 from the low-side of the load 5 to be tested. It is determined that the load 5 to be tested and the drive power supply 6 are short-circuited if the voltage $V_T$ at the voltage sampling point T sampled by the ADC of the microcontroller 4 is equal to the a theoretical value $V_Q$*(R2/(r+R2)) or fluctuates within a certain range of the theoretical value $V_Q$*(R2/(r+R2)). $V_Q$ represents a voltage of the drive power supply 6, and r represents an internal resistance of the load 5 to be tested.

Figure 8:
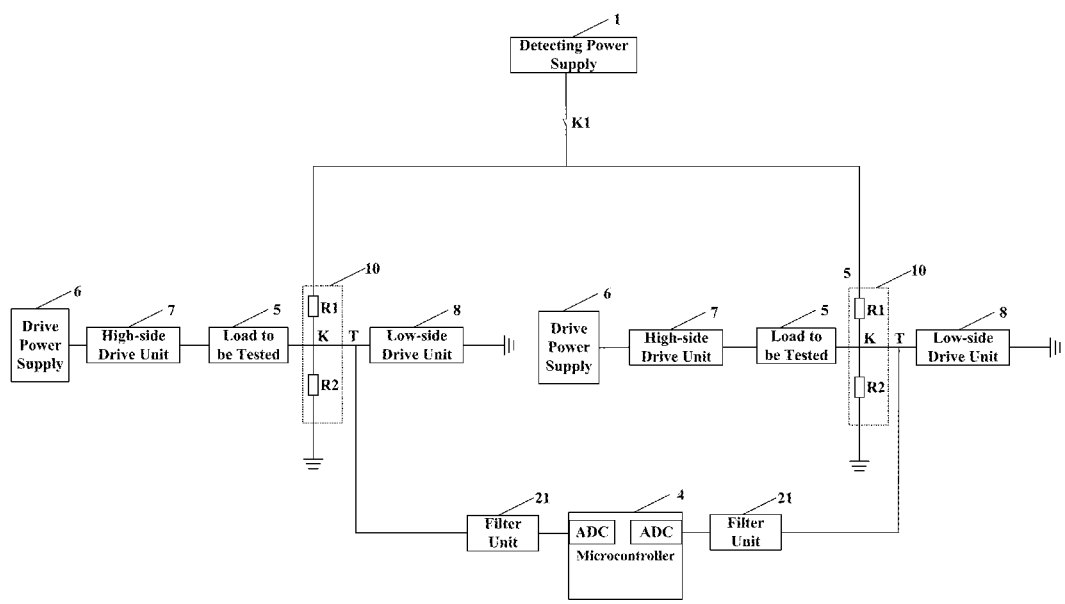
FIG. 8 is a structural diagram of a load state detection circuit according to the present disclosure, wherein there are two loads to be tested.

It shall be noted that the load state detection circuit of the disclosure may further test a plurality of loads 5 to be tested at the same time. With reference to FIG. 8, that there are two loads 5 to be tested is taken as an example. The way to determine a fault of the each of the loads 5 to be tested is similar to the above described, and will not be repeated here. Therefore, the microcontroller 4 may determine whether to power on the loads 5 to be tested according to types of the loads and fault statuses of the loads, which is more secure.

In view of the above, it is provided an implementation manner of determining a specific fault type of the load to be tested when the switch unit is the first switch.

Figure 9:
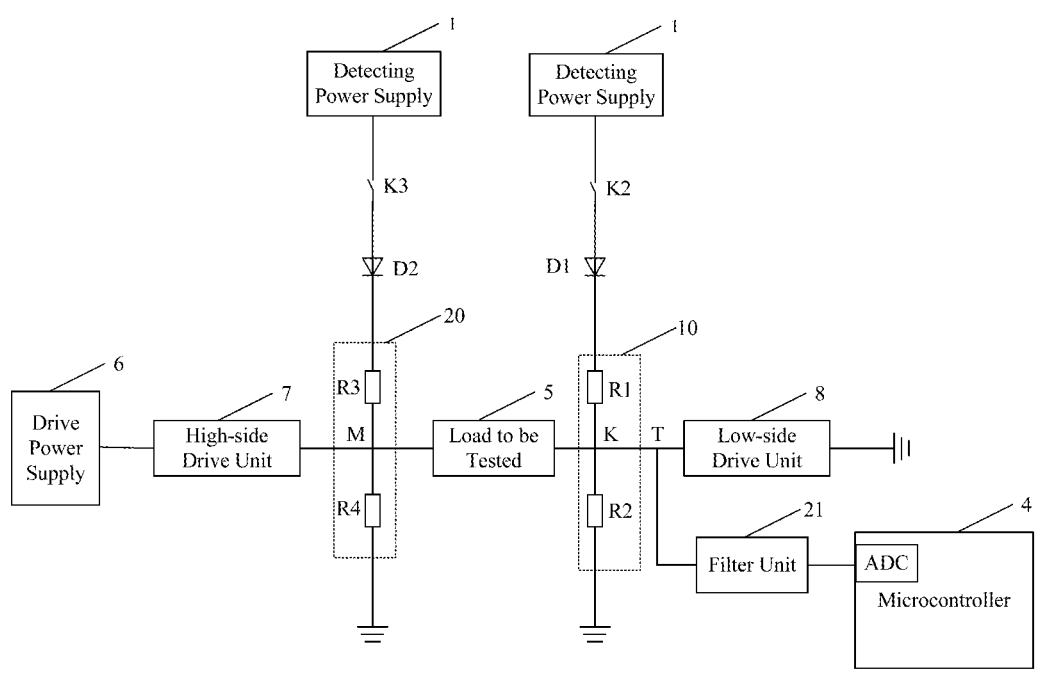
FIG. 9 is a structural diagram of a load state detection circuit according to the present disclosure.

With reference to FIG. 9, it is provided a specific way of determining a fault in the load to be tested when the switch unit 3 includes a second switch K2 and a third switch K3.

The switch unit 3 includes the second switch K2 and the third switch K3. Control terminals of the second switch K2 and the third switch K3 are respectively connected to the microcontroller 4. The load state detection circuit further includes a second voltage divider circuit 20 whose structure may be similar to that of the first voltage divider circuit 10. Specifically, the second voltage divider circuit 20 includes a third resistor network and a fourth resistor network. One terminal of the third resistor network forms a first terminal of the second voltage divider circuit 20, the other terminal of the third resistor network is connected to one terminal of the fourth resistor network. The other terminal of the fourth resistor network is grounded. A junction M of the third resistor network and the fourth resistor network forms a second terminal of the second voltage divider circuit 20. The second terminal of the second voltage divider circuit 20 is connected to one terminal of the load 5 to be tested. It shall be noted that, in this context, that the third resistor network is a third resistor R3 and the fourth resistor network is a fourth resistor R4 is taken as an example for description. However, this disclosure does not impose any limitation to the specific structures of the third resistor network and fourth resistor network.

A first terminal of the second switch K2 and a first terminal of the third switch K3 are respectively connected to at least one detecting power supply 1. A second terminal of the second switch K2 is connected to the first terminal of the first voltage divider circuit 10. A second terminal of the third switch K3 is connected to the first terminal of the second voltage divider circuit 20. The second terminal of the first voltage divider circuit 10 and the second terminal of the second voltage divider circuit 20 are connected to two terminals (high-side and low-side) of the load 5 to be tested, respectively. There may be two detecting power supplies 1, one of which is connected to the first terminal of the second switch K2, while the other detecting power supply 1 is connected to the first terminal of the third switch K3. In this embodiment, the two detecting power supplies 1 may be identical or different, to which this disclosure does not impose any limitation.

As shown in FIG. 9, the first voltage divider circuit 10 includes the first resistor network and the second resistor network. The first resistor network is the first resistor R1, and the second resistor network is the second resistor R2. One detecting power supply 1 is connected to a terminal of the second switch K2. The other terminal of the second switch K2 is connected to a terminal of the first resistor R1 of the first voltage divider circuit 10 via the anti-reverse diode D1. The other terminal of the first resistor R1 is connected to one terminal of the second resistor R2. The other terminal of the second resistor R2 is grounded. The junction K of the first resistor R1 and second resistor forms the second terminal of the first voltage divider circuit 10. The second terminal of the first voltage divider circuit 10 is connected to an terminal of the load 5 to be tested where the voltage sampling point T is formed, i.e., the low-side of the load 5 to be tested. The other detecting power supply 1 is connected to a terminal of the third switch K3, the other terminal of which is connected to one terminal of the third resistor R3 of the second voltage divider circuit 20 via the anti-reverse diode D2. The other terminal of the third resistor R3 is connected to one terminal of the fourth resistor R4. The other terminal of the fourth resistor R4 is grounded. The junction M of the third resistor R3 and the fourth resistor R4 form the second terminal of the second voltage divider circuit 20. The second terminal of the second voltage divider circuit 20 is connected to an terminal of the load 5 to be tested where the voltage sampling point T is not formed, i.e., the high-side of the load 5 to be tested.

Specifically, the microcontroller 4 is configured to control the second switch K2 to switch on and receive the voltage $V_T$ sampled by the ADC at the voltage sampling point T. When $V_T$ is equal to zero, the microcontroller 4 determines that a grounding short circuit fault occurs to a terminal of the load 5 to be tested where the voltage sampling point T is formed, that is, a grounding short circuit fault occurs to the low-side of the load 5 to be tested as shown in FIG. 9. It shall be noted that, in practice, due to the ADC sampling error, transmission line impedance, software calculation error and so on, the fluctuation value $V_b$ may be preset, and when $V_T < V_b$, it may be determined that a grounding short circuit occurs to the low-side of the load 5 to be tested.

When $V_T$ is within a first preset range, the microcontroller 4 determines that a grounding short circuit fault occurs to the terminal of the load 5 to be tested where the voltage sampling point T is not formed, that is, the grounding short circuit fault occurs to the high-side of the load 5 to be tested as shown in FIG. 9. The first preset range shall be set according to the first resistor network, the second resistor network, the internal resistance r of the load 5 to be tested, and the voltage V of the detecting power supply. Specifically, suppose a grounding short circuit fault occurs to the high-side of the load 5 to be tested, then the theoretical value of the voltage $V_T$ at the voltage sampling point T is $V*r*R2/(r*R2+R1*r+R1*R2)$. If a fluctuation value $V_{b1}$ is preset on the basis of the theoretical value, it may be obtained that the first preset range is $[V*r*R2/(r*R2+R1*r+R1*R2)-V_{b1}, V*r*R2/(r*R2+R1*r+R1*R2)+V_{b1}]$. Causes of a fluctuation value include but are not limited to a resistor error in the circuit, an ADC sampling error, a detecting power supply error, a drive power supply error, a transmission line impedance, and software computation error and the like.

The microcontroller 4 is further configured to control the second switch K2 to switch off and the third switch K3 to switch on, and determine that an open circuit fault occurs to the load 5 to be tested when the received voltage $V_T$ at the voltage sampling point T is equal to zero.

Before controlling the second switch K2 and third switch K3 to switch on, the microcontroller 4 determines whether the load 5 to be tested and the drive power supply 6 are short-circuited by controlling the second switch K2 and third switch K3 to disconnect the load 5 to be tested from the two detecting power supplies 1 and according to whether the received voltage at the voltage sampling point T is a voltage of the drive power supply 6. Take FIG. 9 for example, where the microcontroller 4 controls the second switch K2 and third switch K3 to disconnect the two detecting power supplies 1 from the high-side and low-side of the load 5 to be tested. It is determined that the load 5 to be tested and the drive power supply 6 are short-circuited if the voltage $V_T$ at the voltage sampling point T sampled by the ADC of the microcontroller 4 is equal to the theoretical value $V_Q*(R2/(r+R2))$ or fluctuates within a certain range of the theoretical value $V_Q*(R2/(r+R2))$. $V_Q$ represents a voltage of the drive power supply 6, and r represents an internal resistance of the load 5 to be tested.

It shall be noted that when controlling the second switch K2 to switch on, the microcontroller 4 may simultaneously control the third switch K3 to switch on, and then control the second switch K2 to switch off, which may reduce charge and discharge time of the filter unit 21 (capacitor) and thereby reducing the detection delay time, as compared with separately controlling the second switch K2 and the third switch K3 to switch on in sequence.

Figure 10:
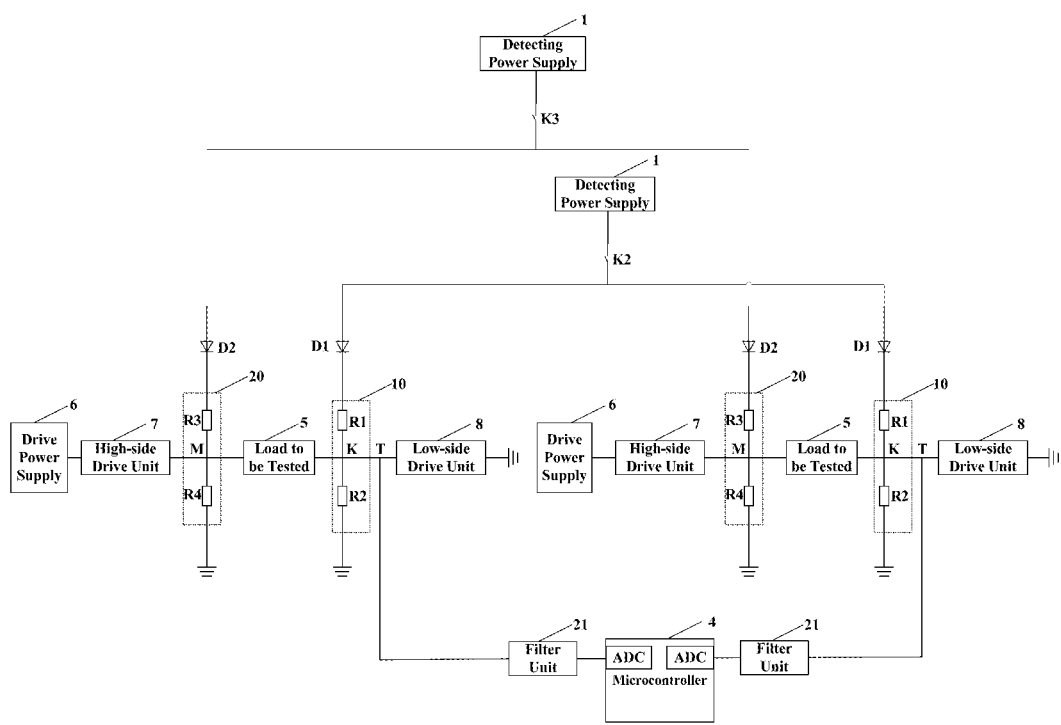
FIG. 10 is a structural diagram of a load state detection circuit according to the present disclosure; wherein there are two loads to be tested.

It shall be noted that the load state detection circuit of the present disclosure may further test a plurality of loads 5 to be tested at the same time. With reference to FIG. 10, that there are two loads 5 to be tested is taken as an example. High-sides of the plurality of loads 5 to be tested share one detecting power supply 1, and low-sides of the plurality of loads 5 to be tested share one detecting power supply 1. The way to determine the fault of each of the loads 5 to be tested is similar to the above described, and will not be repeated here. Therefore, the microcontroller 4 may determine whether to power on the loads 5 to be tested according to types of the loads and fault statuses of the loads, which is more secure.

In this way, it is provided an implementation manner of determining a specific fault type of the load to be tested when the switch unit includes the second switch and the third switch.

The present disclosure further relates to a load state detection method, applied to any load state detection circuit abovementioned. The load state detection circuit with reference to FIGS. 1 to 3 is taken as an example for description.

Figure 11:
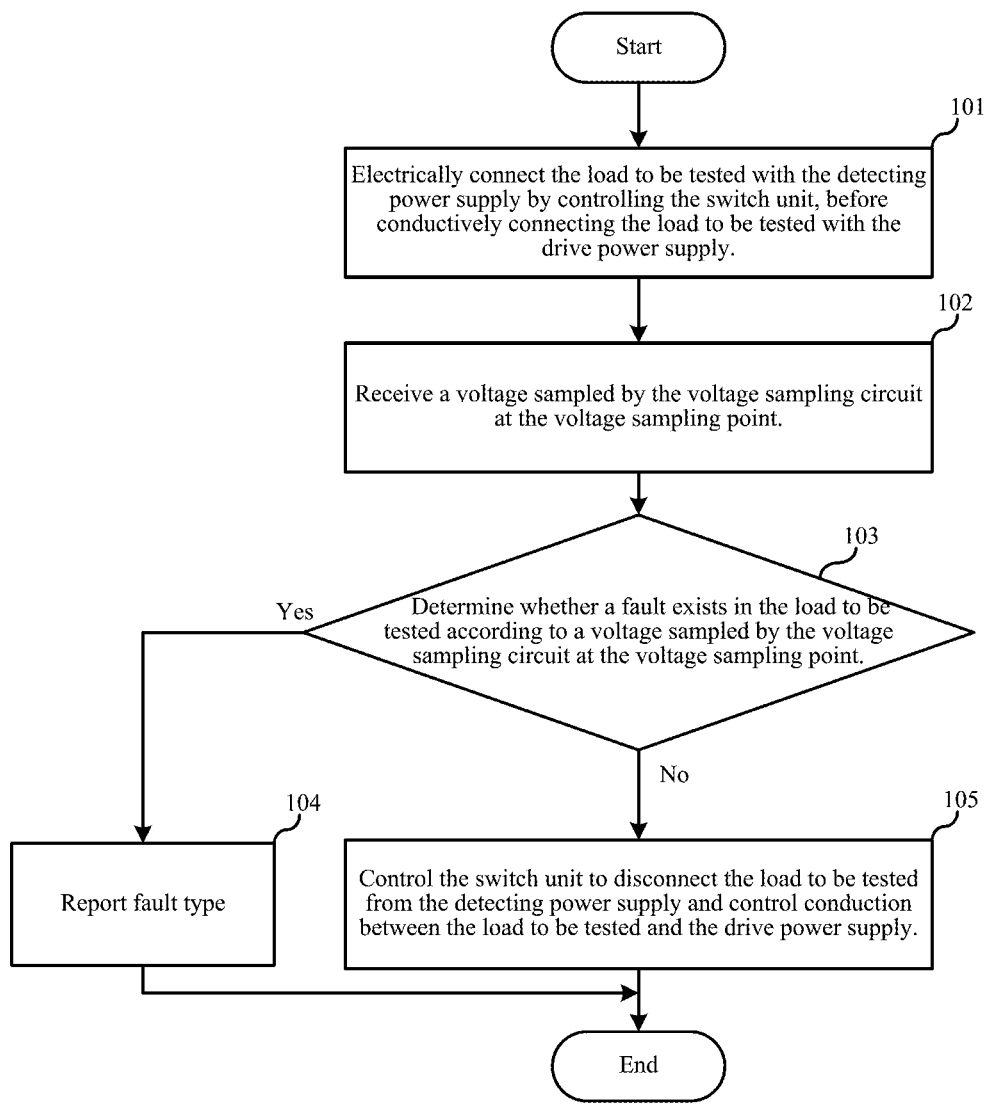
FIG. 11 is a detailed flowchart of a load state detection method according to the present disclosure.

A specific flow of the load state detection method is shown in FIG. 11.

In step 101, the load to be tested is connected with the detecting power supply by controlling the switch unit, before the load to be tested is conductively connected with the drive power supply.

Specifically, the microcontroller 4 connects the load 5 to be tested with the detecting power supply 1 by controlling the switch unit 3, before conductively connecting the load 5 to be tested with the drive power supply 6, i.e., before powering on the load 5 to be tested.

In step 102, a voltage sampled by the voltage sampling circuit at the voltage sampling point is received.

Specifically, the voltage sampling circuit 2 may sample a voltage at the voltage sampling point T, and output the voltage to the microcontroller 4. The microcontroller 4 receives the voltage sampled by the voltage sampling circuit 2 at the voltage sampling point T.

In step 103, it is determined whether a fault exists in the load to be tested according to the voltage sampled by the voltage sampling circuit at the voltage sampling point. If a fault exists, a step 104 will be performed. If no fault exists, a step 105 will be performed.

Specifically, the load state detection circuit in FIG. 2 is taken as an example. When $V_T$ is equal to zero, the microcontroller 4 determines that a grounding short circuit fault occurs to the low-side of the load 5 to be tested. Due to the ADC sampling error, transmission line impedance, software calculation error and so on, the fluctuation value $V_b$ may be preset, and when $V_T < V_b$, it may be determined that a grounding short circuit occurs to the low-side of the load 5 to be tested. If a fault exists, the microcontroller 4 needs to determine whether to conductively connect the drive power supply 6 with the load 5 to be tested according to the type of the load to be tested and the fault type of the load 5 to be tested, and the step 104 will be performed. If no fault exists, the step 105 will be performed.

In one example, the microcontroller 4 is further configured to disconnect the load 5 to be tested from the detecting power supply 1 by controlling the switch unit 3, and then determine whether the load 5 to be tested and the drive power supply 6 are short-circuited according to whether the received voltage at the voltage sampling point T is a voltage of the drive power supply 6, before conductively connecting the load 5 to be tested with the drive power supply 6. Take FIG. 2 as an example, the microcontroller 4 disconnects the detecting power supply 1 from the low-side of the load 5 to be tested by controlling the switch unit 3, and the ADC in the microcontroller 4 samples the voltage $V_T$ at the voltage sampling point T. The microcontroller 4 determines that the load 5 to be tested and the drive power supply 6 are short-circuited when $V_T$ is equal to the voltage of the drive power supply 6 or fluctuates within a certain range of the voltage of the drive power supply 6.

In step 104, the fault type is reported.

Specifically, the microcontroller 4 reports the fault type to a superior controller.

In step 105, the switch unit is controlled to disconnect the load to be tested from the detecting power supply and the conductive connection between the load to be tested and the drive power supply is controlled.

Specifically, the microcontroller 4 controls the switch unit 3 to disconnect the load 5 to be tested from the detecting power supply 1 to avoid affecting normal operation of the load 5 to be tested. The microcontroller 4 further controls the conductive connection between the load 5 to be tested and the drive power supply 6, that is, the microcontroller 4 controls the high-side drive unit 7 and the low-side drive unit 8 to switch on to power on the load 5 to be tested.

It shall be noted that, the steps 101 to 104 is a one-time load state detection flow, and the load 5 to be tested is powered on if no fault exists after the one-time detection of the load 5 to be tested, to which this disclosure is not limited, but the load 5 to be tested is powered on if no fault exists after a plurality of times of detections of the load 5 to be tested.

In other examples, the load state detection methods may correspond to the load state detection circuits abovementioned, thus several load state detection methods may be set in view of the load state detection circuits. Relevant technical details in the load state detection circuits are still effective in the load state detection methods and the technical effects that may be achieved in the load state detection circuits may be achieved in the load state detection methods, which will not be repeated here to avoid repetition. Correspondingly, relevant technical details in the load state detection methods may also be applied to the load state detection circuits.

In this disclosure, compared with the existing technologies, before the load to be tested and the drive power supply are conductively connected, i.e., before powering on the load to be tested, the load to be tested and the detecting power supply are connected by controlling the switch unit. At this time, a voltage at the voltage sampling point (the voltage sampling point is formed at either terminal of the load to be tested) is sampled by the voltage sampling circuit, it is determined whether a fault exists in the load to be tested according to the received voltage at the voltage sampling point, and when it is determined that no fault exists in the load to be tested, the load to be tested is disconnected from the detecting power supply by controlling the switch unit, so as to avoid interference of the detecting power supply and then the load to be tested is powered on. In the present disclosure, before the load to be tested is powered on, it is possible to determine in advance whether a fault exists in the load to be tested. The load to be tested will not be powered on until it is determined that no fault exists in the load to be tested, thereby safety is improved.

Those skilled in the art should appreciate that the aforementioned embodiments are specific embodiments for implementing the present disclosure. In practice, however, many changes can be made in the forms and details of the specific embodiments without departing from the scope of the disclosure.

What is claimed is:

1. A load state detection circuit, comprising: at least one detecting power supply, a voltage sampling circuit, a switch unit, and a microcontroller;

wherein the microcontroller is connected to the switch unit, the switch unit is connected between the detecting power supply and the load to be tested;

wherein a voltage sampling point is formed at either terminal of a load to be tested, and the voltage sampling circuit is connected between the voltage sampling point and the microcontroller;

wherein the voltage sampling circuit is configured to sample a voltage at the voltage sampling point, and output the voltage to the microcontroller;

wherein the microcontroller is configured to, before conductively connecting the load to be tested with a drive power supply, electrically connect the load to be tested and the detecting power supply by controlling the switch unit, and determine whether a fault exists in the load to be tested according to a received voltage at the voltage sampling point sampled by the voltage sampling circuit; and wherein the microcontroller is further configured to, when it is determined that no fault exists in the load to be tested, disconnect the load to be tested from the detecting power supply by controlling the switch unit, and control conductive connection between the load to be tested and the drive power supply to drive the load to be tested to work;

wherein, the load state detection circuit further comprising: a first voltage divider circuit;

wherein the switch unit is connected to a first terminal of the first voltage divider circuit, a second terminal of the first voltage divider circuit is connected to a terminal of the load to be tested, and a third terminal of the first voltage divider circuit is grounded;

wherein the switch unit is a first switch; a control terminal of the first switch is connected to the microcontroller, one terminal of the first switch is connected to the detecting power supply, the other terminal of the first switch is connected to the first terminal of the first voltage divider circuit, and the second terminal of the first voltage divider circuit is connected to a terminal of the load to be tested where the voltage sampling point is formed; and wherein the microcontroller is configured to control the first switch to switch on, and determine that a grounding short circuit fault occurs to a terminal of the load to be tested where the voltage sampling point is formed when the received voltage at the voltage sampling point is equal to zero; and the microcontroller is further configured to determine that a grounding short circuit fault occurs to a terminal of the load to be tested where no voltage sampling point is formed when the received voltage at the voltage sampling point is within a first preset range.

2. The load state detection circuit according to claim 1, wherein the microcontroller is further configured to, before conductively connecting the load to be tested with the drive power supply, disconnect the load to be tested from the detecting power supply by controlling the switch unit, and determine whether the load to be tested and the drive power supply are short-circuited according to whether the received voltage at the voltage sampling point is a voltage of the drive power supply.

3. The load state detection circuit according to claim 1, wherein the first voltage divider circuit comprises a first resistor network and a second resistor network;

wherein the switch unit is connected to one terminal of the first resistor network, and the other terminal of the first resistor network is connected to a terminal of the second resistor network; and wherein the one terminal of the first resistor network forms the first terminal of the first voltage divider circuit, a junction of the first resistor network and the second resistor network forms the second terminal of the first voltage divider circuit, and the other terminal of the second resistor network forms the third terminal of the first voltage divider circuit.

4. The load state detection circuit according to claim 1, wherein the voltage sampling circuit comprises a filter unit and an analog-to-digital converter;

wherein a first terminal of the analog-to-digital converter is connected to the voltage sampling point via the filter unit, while a second terminal of the analog-to-digital converter is connected to the microcontroller.

5. The load state detection circuit according to claim 1, further comprising at least one anti-reverse diode, wherein at least one terminal of the load to be tested is connected to the switch unit via the at least one anti-reverse diode.

6. The load state detection circuit according to claim 3, wherein a resistance value of the first resistor network and a resistance value of the second resistor network is greater than an internal resistance of the load to be tested.

7. A load state detection circuit, comprising: at least one detecting power supply, a voltage sampling circuit, a switch unit, and a microcontroller;

wherein the microcontroller is connected to the switch unit, the switch unit is connected between the detecting power supply and a load to be tested;

wherein a voltage sampling point is formed at either terminal of the load to be tested, and the voltage sampling circuit is connected between the voltage sampling point and the microcontroller;

wherein the voltage sampling circuit is configured to sample a voltage at the voltage sampling point, and output the voltage to the microcontroller;

wherein the microcontroller is configured to, before conductively connecting the load to be tested with a drive power supply, electrically connect the load to be tested and the detecting power supply by controlling the switch unit, and determine whether a fault exists in the load to be tested according to a received voltage at the voltage sampling point sampled by the voltage sampling circuit; and wherein the microcontroller is further configured to, when it is determined that no fault exists in the load to be tested, disconnect the load to be tested from the detecting power supply by controlling the switch unit, and control conductive connection between the load to be tested and the drive power supply to drive the load to be tested to work;

wherein, the load state detection circuit further comprising: a first voltage divider circuit;

wherein the switch unit is connected to a first terminal of the first voltage divider circuit, a second terminal of the first voltage divider circuit is connected to a terminal of the load to be tested, and a third terminal of the first voltage divider circuit is grounded;

wherein the switch unit comprises a second switch and a third switch; wherein a control terminal of the second switch and a control terminal of the third switch are respectively connected to the microcontroller; the load state detection circuit further comprises a second voltage divider circuit;

wherein a first terminal of the second switch and a first terminal of the third switch are respectively connected to the at least one detecting power supply, a second terminal of the second switch is connected to the first terminal of the first voltage divider circuit, a second terminal of the third switch is connected to a first terminal of the second voltage divider circuit, the second terminal of the first voltage divider circuit and a second terminal of the second voltage divider circuit are connected to two terminals of the load to be tested, respectively, and a third terminal of the second voltage divider circuit is grounded; and wherein the microcontroller is specifically configured to control the second switch to switch on, and determine that a grounding short circuit fault occurs to a terminal of the load to be tested where the voltage sampling point is formed when the received voltage at the voltage sampling point is equal to zero; and the microcontroller is further configured to determine that a grounding short circuit fault occurs to a terminal of the load to be tested where no voltage sampling point is formed when the received voltage at the voltage sampling point is within the first preset range.

8. The load state detection circuit according to claim 7, wherein the microcontroller is further configured to control the second switch to switch off and the third switch to switch on, and determine that an open circuit fault occurs to the load to be tested when the received voltage at the voltage sampling point is equal to zero.

9. The load state detection circuit according to claim 7, wherein there are two detecting power supplies, one of which is connected to the first terminal of the second switch, while the other is connected to the first terminal of the third switch.

10. The load state detection circuit according to claim 7, wherein the microcontroller is further configured to, before conductively connecting the load to be tested with the drive power supply, disconnect the load to be tested from the detecting power supply by controlling the switch unit, and determine whether the load to be tested and the drive power supply are short-circuited according to whether the received voltage at the voltage sampling point is a voltage of the drive power supply.

11. The load state detection circuit according to claim 7, wherein the voltage sampling circuit comprises a filter unit and an analog-to-digital converter;
   wherein a first terminal of the analog-to-digital converter is connected to the voltage sampling point via the filter unit, while a second terminal of the analog-to-digital converter is connected to the microcontroller.

12. The load state detection circuit according to claim 7, further comprising at least one anti-reverse diode, wherein at least one terminal of the load to be tested is connected to the switch unit via the at least one anti-reverse diode.

13. The load state detection circuit according to claim 7, wherein the first voltage divider circuit comprises a first resistor network and a second resistor network;
   wherein the switch unit is connected to one terminal of the first resistor network, and the other terminal of the first resistor network is connected to a terminal of the second resistor network; and
   wherein the one terminal of the first resistor network forms the first terminal of the first voltage divider circuit, a junction of the first resistor network and the second resistor network forms the second terminal of the first voltage divider circuit, and the other terminal of the second resistor network forms the third terminal of the first voltage divider circuit.

14. The load state detection circuit according to claim 13, wherein a resistance value of the first resistor network and a resistance value of the second resistor network is greater than an internal resistance of the load to be tested.

15. A load state detection method, being applied to a microcontroller of a load state detection circuit comprising at least a detecting power supply, a voltage sampling circuit, a switch unit, and a microcontroller; wherein the microcontroller is connected to the switch unit, the switch unit is connected between the detecting power supply and a load to be tested; wherein a voltage sampling point is formed at either terminal of the load to be tested, and the voltage sampling circuit is connected between the voltage sampling point and the microcontroller;
   wherein the method comprises:
   electrically connecting the load to be tested with the detecting power supply by controlling the switch unit, before conductively connecting the load to be tested with a drive power supply;
   receiving a voltage sampled by the voltage sampling circuit at the voltage sampling point;
   determining whether a fault exists in the load to be tested according to the voltage sampled by the voltage sampling circuit at the voltage sampling point; and
   controlling the switch unit to disconnect the load to be tested from the detecting power supply and controlling the load to be tested to be conductively connected with the drive power supply to drive the load to be tested to work, when it is determined that no fault exists in the load to be tested;

wherein the method further comprises:
   before conductively connecting the load to be tested with the drive power supply, disconnecting the load to be tested with the detecting power supply by controlling the switch unit;
   receiving a voltage sampled by the voltage sampling circuit at the voltage sampling point (T);
   determining that the load to be tested and the drive power supply are short-circuited, when it is determined that the received voltage at the voltage sampling point (T) is a voltage of the drive power supply;
   controlling the load to be tested to be conductively connected with the drive power supply to drive the load to be tested to work, when it is determined that the load to be tested and the drive power supply are not short-circuited.

16. The load state detection method according to claim 15, being applied to the microcontroller of the load state detection circuit, wherein the load state detection circuit further comprises: a first voltage divider circuit; wherein the switch unit is connected to a first terminal of the first voltage divider circuit, a second terminal of the first voltage divider circuit is connected to a terminal of the load to be tested, and a third terminal of the first voltage divider circuit is grounded;
   the first voltage divider circuit comprises a first resistor network and a second resistor network; wherein the switch unit is connected to one terminal of the first resistor network, and the other terminal of the first resistor network is connected to a terminal of the second resistor network; and wherein the one terminal of the first resistor network forms the first terminal of the first voltage divider circuit, a junction of the first resistor network and the second resistor network forms the second terminal of the first voltage divider circuit, and the other terminal of the second resistor network forms the third terminal of the first voltage divider circuit;
   the switch unit is a first switch; a control terminal of the first switch is connected to the microcontroller, one terminal of the first switch is connected to the detecting power supply, the other terminal of the first switch is connected to the first terminal of the first voltage divider circuit, and the second terminal of the first voltage divider circuit is connected to a terminal of the load to be tested where the voltage sampling point is formed;
   wherein the method further comprises:
   before conductively connecting the load to be tested with the drive power supply, electrically connecting the load to be tested with the detecting power supply by controlling the first switch;
   receiving a voltage sampled by the voltage sampling circuit at the voltage sampling point;
   determining that a grounding short circuit fault occurs to a terminal of the load to be tested where the voltage sampling point is formed when the received voltage at the voltage sampling point is equal to zero; determining that a grounding short circuit fault occurs to the terminal of the load 5 to be tested where the voltage sampling point T is not formed when the voltage sampled at the voltage sampling point is $V*r*R2/(r*R2+R1*r+R1*R2)$; wherein R1 represents a resistance of the first resistor, R2 represents a resistance of the second resistor, r represents an internal resistance of the load to be tested, V represents a voltage of the detecting power supply.

17. The load state detection method according to claim 15, being applied to the microcontroller of the load state detection circuit; wherein the load state detection circuit further comprises: a first voltage divider circuit; wherein the switch unit is connected to a first terminal of the first voltage divider circuit, a second terminal of the first voltage divider circuit is connected to a terminal of the load to be tested, and a third terminal of the first voltage divider circuit is grounded;

the first voltage divider circuit comprises a first resistor network and a second resistor network; wherein the switch unit is connected to one terminal of the first resistor network, and the other terminal of the first resistor network is connected to a terminal of the second resistor network; and wherein the one terminal of the first resistor network forms the first terminal of the first voltage divider circuit, a junction of the first resistor network and the second resistor network forms the second terminal of the first voltage divider circuit, and the other terminal of the second resistor network forms the third terminal of the first voltage divider circuit the switch unit is a first switch; a control terminal of the first switch is connected to the microcontroller, one terminal of the first switch is connected to the detecting power supply, the other terminal of the first switch is connected to the first terminal of the first voltage divider circuit, and the second terminal of the first voltage divider circuit is connected to a terminal of the load to be tested where no voltage sampling point is formed; the method further comprises:

before conductively connecting the load to be tested with the drive power supply, electrically connecting the load to be tested with the detecting power supply by controlling the first switch;

receiving a voltage sampled by the voltage sampling circuit at the voltage sampling point;

determining that a fault occurs to the load to be tested when the received voltage at the voltage sampling point is equal to zero;

electrically disconnecting the load to be tested with the detecting power supply by controlling the first switch;

receiving a voltage sampled by the voltage sampling circuit at the voltage sampling point;

determining that the load to be tested and the drive power supply are short-circuited, when it is determined that the voltage sampled at the voltage sampling point is $VQ*(R2/(r+R2))$; wherein VQ represents a voltage of the drive power supply, r represents an internal resistance of the load to be tested, R2 represents a resistance of the second resistor.

18. The load state detection method according to claim 15, being applied to the microcontroller of the load state detection circuit, wherein the load state detection circuit further comprises: a first voltage divider circuit and a second voltage divider circuit; the switch unit comprises a second switch and a third switch;

wherein the second switch is connected to a first terminal of the first voltage divider circuit, a second terminal of the first voltage divider circuit is connected to a terminal of the load to be tested, and a third terminal of the first voltage divider circuit is grounded;

the first voltage divider circuit comprises a first resistor network and a second resistor network; wherein the second switch is connected to one terminal of the first resistor network, and the other terminal of the first resistor network is connected to a terminal of the second resistor network; and wherein the one terminal of the first resistor network forms the first terminal of the first voltage divider circuit, a junction of the first resistor network and the second resistor network forms the second terminal of the first voltage divider circuit, and the other terminal of the second resistor network forms the third terminal of the first voltage divider circuit;

a control terminal of the second switch is connected to the microcontroller, one terminal of the second switch is connected to the detecting power supply, the other terminal of the second switch is connected to the first terminal of the first voltage divider circuit, and the second terminal of the first voltage divider circuit is connected to a terminal of the load to be tested where the voltage sampling point is formed;

wherein the third switch is connected to a first terminal of the second voltage divider circuit, a second terminal of the second voltage divider circuit is connected to a terminal of the load to be tested, and a third terminal of the second voltage divider circuit is grounded;

the second voltage divider circuit comprises a third resistor network and a fourth resistor network; wherein the third switch is connected to one terminal of the third resistor network, and the other terminal of the third resistor network is connected to a terminal of the fourth resistor network; and wherein the one terminal of the third resistor network forms the first terminal of the second voltage divider circuit, a junction of the third resistor network and the fourth resistor network forms the second terminal of the second voltage divider circuit, and the other terminal of the fourth resistor network forms the third terminal of the second voltage divider circuit;

a control terminal of the third switch is connected to the microcontroller, one terminal of the third switch is connected to the detecting power supply, the other terminal of the third switch is connected to the first terminal of the second voltage divider circuit, and the second terminal of the second voltage divider circuit is connected to a terminal of the load to be tested where no voltage sampling point is formed; the method comprises:

before conductively connecting the load to be tested with the drive power supply, electrically connecting a low terminal of the load to be tested with the detecting power supply by controlling the second switch, electrically disconnecting a high terminal of the load to be tested with the detecting power supply by controlling the third switch;

receiving a voltage sampled by the voltage sampling circuit at the voltage sampling point;

determining that a grounding short circuit fault occurs to the low terminal of the load to be tested when the received voltage at the voltage sampling point is equal to zero; determining that a grounding short circuit fault occurs to the high terminal of the load to be tested when the voltage sampled at the voltage sampling point is $V*r*R2/(r*R2+R1*r+R1*R2)$; wherein R1 represents a resistance of the first resistor, R2 represents a resistance of the second resistor, r represents an internal resistance of the load to be tested, V represents a voltage of the detecting power supply;

electrically disconnecting the low terminal of the load to be tested with the detecting power supply by controlling the second switch unit, electrically connecting the high terminal of the load to be tested with the detecting power supply by controlling the third switch;

receiving a voltage sampled by the voltage sampling circuit at the voltage sampling point;

determining that an open fault occurs to the load to be tested when the received voltage at the voltage sampling point is equal to zero;

electrically disconnecting the low terminal of the load to be tested with the detecting power supply by controlling the second switch unit, electrically disconnecting the high terminal of the load to be tested with the detecting power supply by controlling the third switch;

receiving a voltage sampled by the voltage sampling circuit at the voltage sampling point;

determining that the load to be tested and the drive power supply are short-circuited, when it is determined that the voltage sampled at the voltage sampling point is VQ*(R2/(r+R2)); wherein VQ represents a voltage of the drive power supply, r represents an internal resistance of the load to be tested, R2 represents a resistance of the second resistor.

* * * * *